(12) United States Patent
Li et al.

(10) Patent No.: US 8,723,622 B2
(45) Date of Patent: May 13, 2014

(54) RADIO FREQUENCY FILTER

(75) Inventors: Shen-Chun Li, Taipei Hsien (TW); Shou-Kuo Hsu, Taipei Hsien (TW); Yung-Chieh Chen, Taipei Hsien (TW); Hsien-Chuan Liang, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 1040 days.

(21) Appl. No.: 12/638,992

(22) Filed: Dec. 16, 2009

(65) Prior Publication Data

US 2011/0102103 A1    May 5, 2011

(30) Foreign Application Priority Data

Oct. 30, 2009    (CN) .......................... 2009 1 0309087

(51) Int. Cl.
*H03H 7/01*    (2006.01)
(52) U.S. Cl.
USPC .......................................... 333/185; 333/175

(58) Field of Classification Search
USPC .................................. 333/168, 175, 176, 185
See application file for complete search history.

(56) References Cited

U.S. PATENT DOCUMENTS

| 3,581,249 A * | 5/1971 | Spangler et al. ............... 333/185 |
| 8,232,853 B2 * | 7/2012 | Ryou et al. ..................... 333/246 |
| 2008/0136560 A1 * | 6/2008 | Bavisi et al. .................. 333/168 |
| 2008/0161886 A1 * | 7/2008 | Stevenson et al. ............. 607/60 |
| 2012/0161901 A1 * | 6/2012 | Stevenson et al. ............ 333/175 |

FOREIGN PATENT DOCUMENTS

CN    201247691 Y    5/2009

\* cited by examiner

*Primary Examiner* — Benny Lee
*Assistant Examiner* — Gerald Stevens
(74) *Attorney, Agent, or Firm* — Novak Druce Connolly Bove + Quigg LLP

(57) ABSTRACT

Parameters of a radio frequency filter can be changed by changing structure of each component of the filter. Material of each component, diameters of each of magnetic cylinders, density of each of conductive coils, and thickness of each of dielectric layers can be changed. When any component needs to be replaced, the filter can be detached as needed.

11 Claims, 8 Drawing Sheets

RADIO FREQUENCY FILTER

BACKGROUND

1. Technical Field

The present disclosure relates to radio frequency (RF) filters, and particularly to an adjustable RF filter.

2. Description of Related Art

Nowadays, in response to various frequency bands of an electronic device, filters have been demanded to remove noise in frequency bands. Filters are generally designed to remove noise from specific frequency bands, therefore different filters with different parameters are designed for different applications. Filters designed in this way are not easily adjustable for parameters in applications other than what they were specifically designed for.

DETAILED DESCRIPTION

Figure 1:
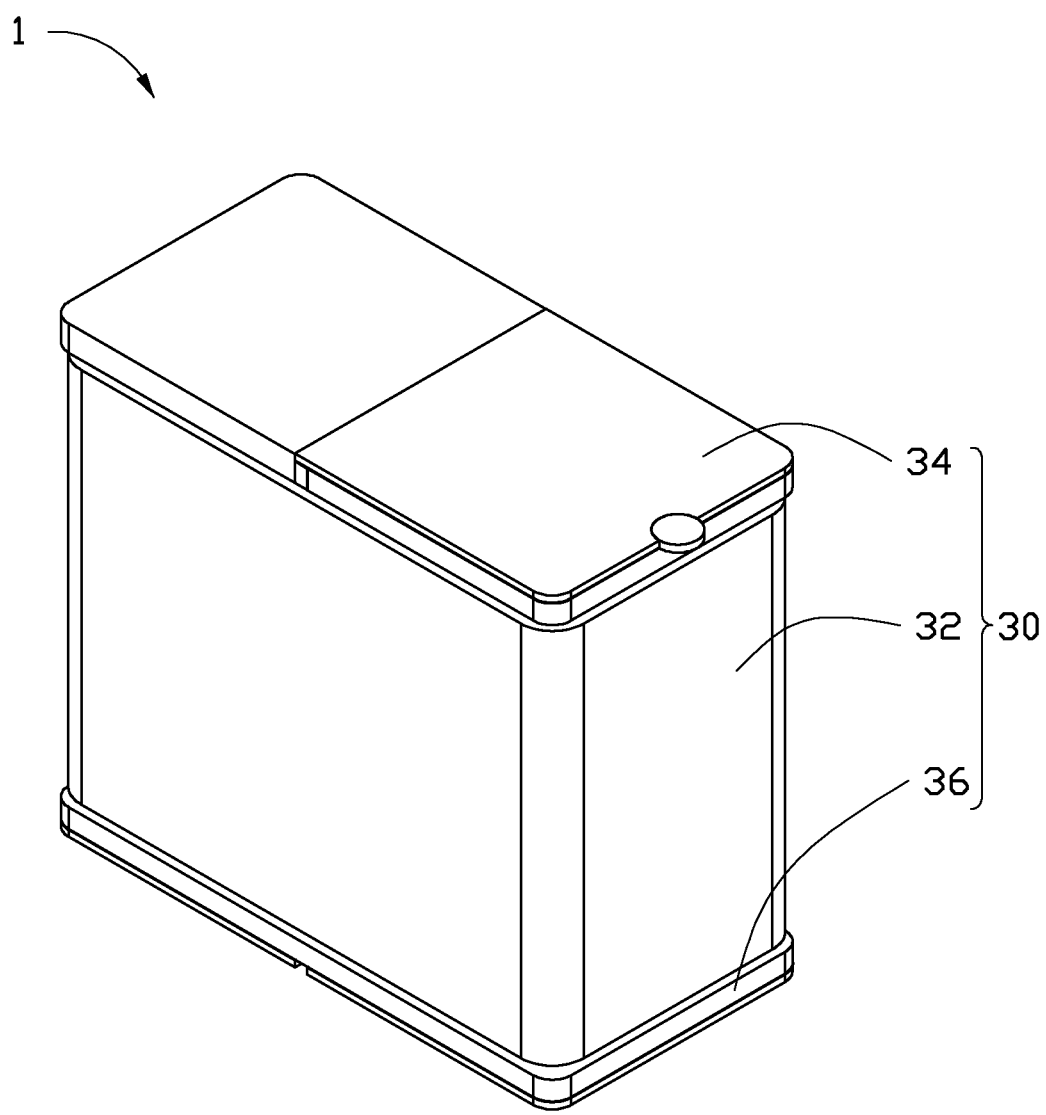
FIG. 1 is an isometric view of an exemplary embodiment of a radio frequency (RF) filter.
Figure 2:
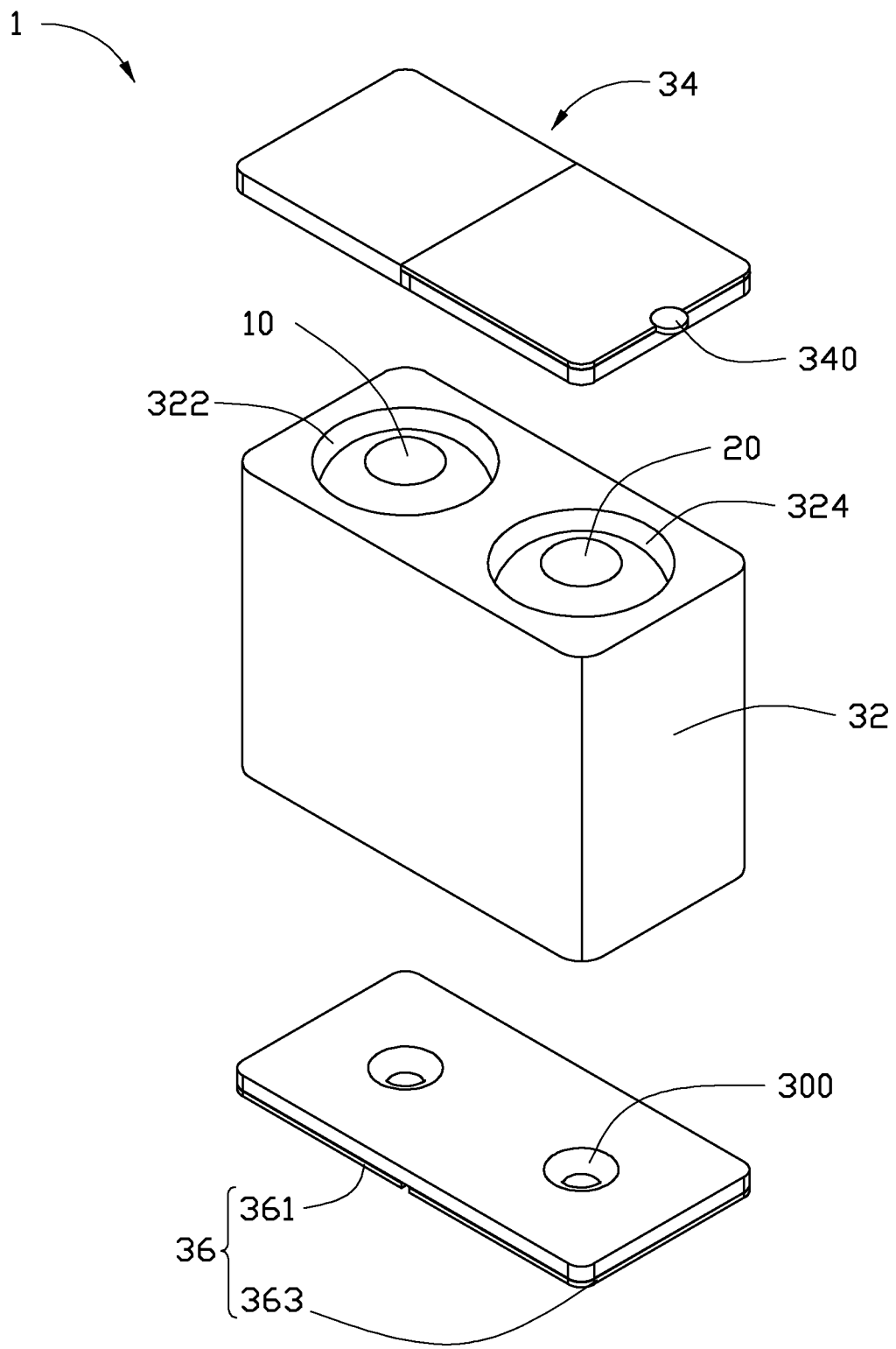
FIG. 2 is an exploded, isometric view of the RF filter of FIG. 1, the RF filter including a serial inductance capacitance (LC) filtering unit and a parallel LC filtering unit.

Referring to FIGS. 1 and 2, an exemplary embodiment of a radio frequency (RF) filter 1 includes a serial inductance capacitance (LC) filtering unit 10, a parallel LC filtering unit 20, and a receiving unit 30 connected to the serial LC filtering unit 10 and the parallel LC filtering unit 20.

Figure 3:
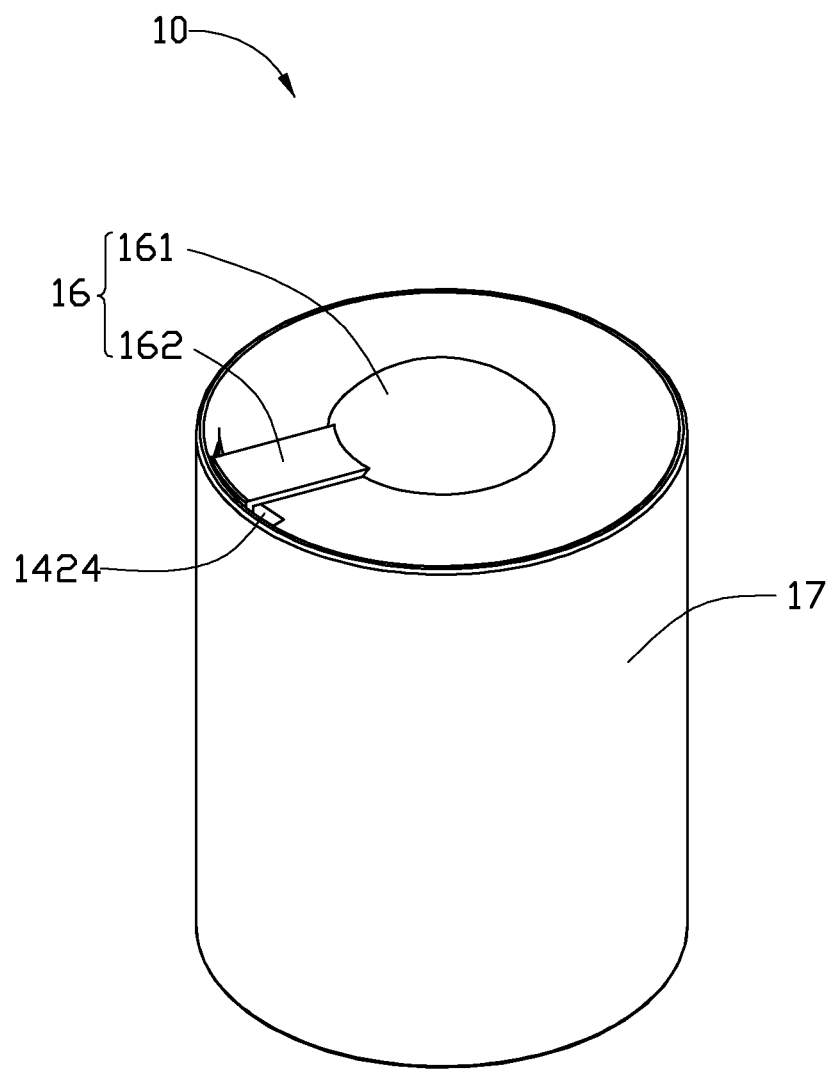
FIG. 3 is an isometric view of the serial LC filtering unit of FIG. 2.
Figure 4:
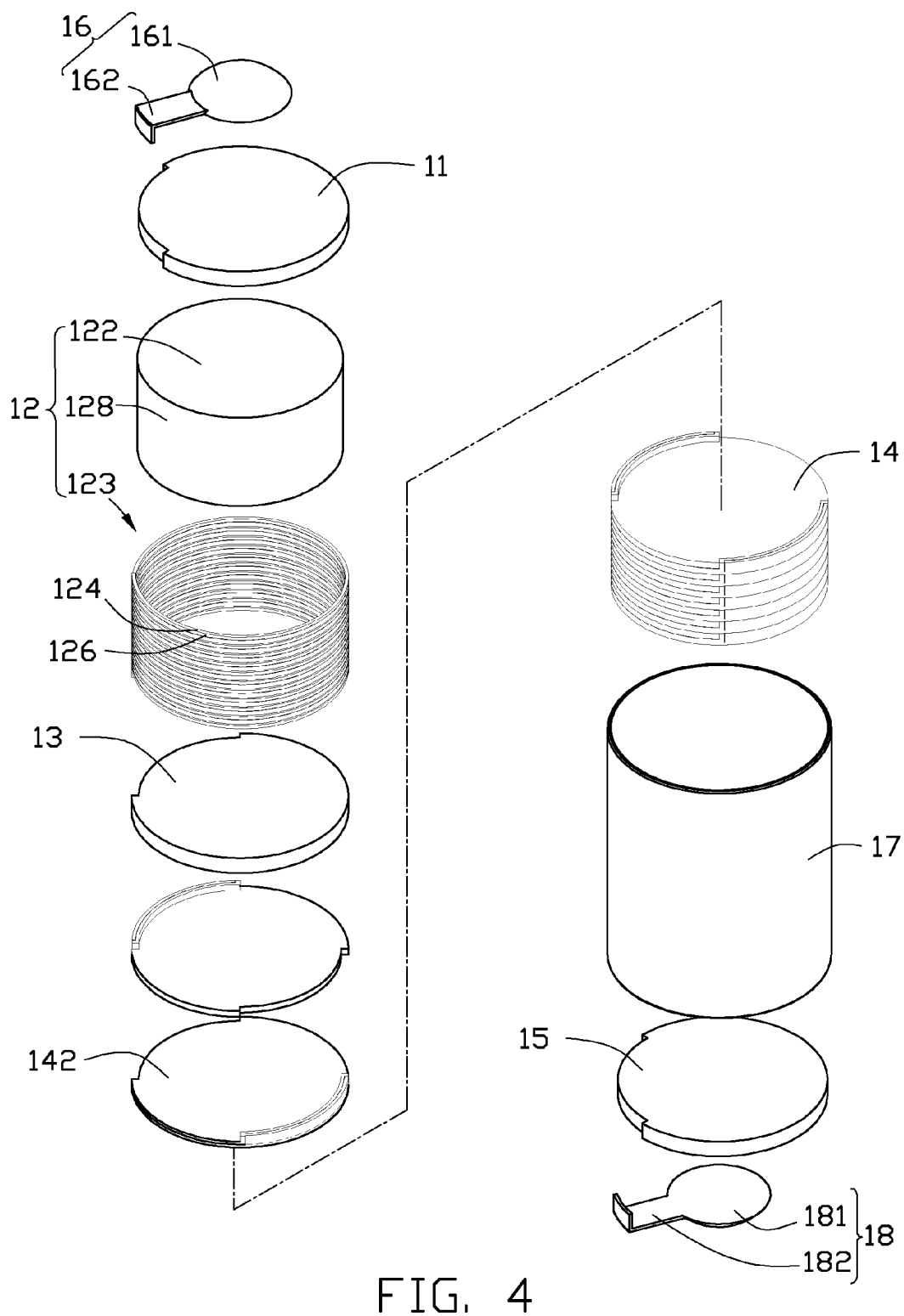
FIG. 4 is an exploded, isometric view of the serial LC filtering unit of FIG. 3, the serial LC filtering unit including a circular-shaped lamination.
Figure 5:
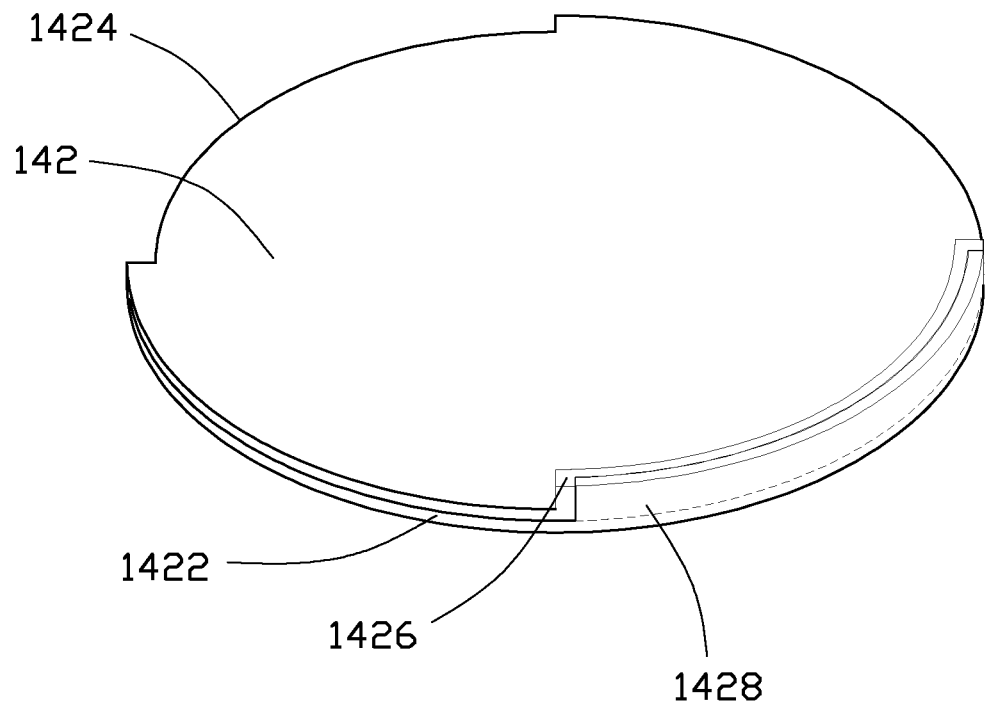
FIG. 5 is an enlarged, isometric view of the circular-shaped lamination of FIG. 4.

Referring to FIGS. 3 to 5, the serial LC filtering unit 10 includes an inductive component 12, a capacitive component 14, two connection members 16, 18, three circular-shaped insulation pieces 11, 13, 15, and an insulation sleeve 17. The inductive component 12 and the capacitive component 14 are connected in series between the connection members 16, 18, and are received in the insulation sleeve 17. The connection members 16, 18 are located on opposite ends of the insulation sleeve 17 correspondingly.

The inductive component 12 includes a magnetic cylinder 122 and an elastic coil 123 coiling around the magnetic cylinder 122. A dielectric layer 128 covers a circumference of the magnetic cylinder 122. The conductive coil 123 includes a helical conductive coil 124 and a helical insulation coil 126. The conductive coil 124 and the insulation coil 126 stagger with each other and coil around the magnetic cylinder 122, to prevent each coil of the conductive coil 124 from contacting with adjacent coils. The magnetic cylinder 122 can be made of magnetic material, such as iron, cobalt, nickel, etc.

The capacitive component 14 includes a number of detachable components. Each detachable component is a circular-shaped lamination 142. A conductive layer 1422 is located at a circumference of each lamination 142, adjacent to a bottom of the lamination 142. A height of the conductive layer 1422 is less than a height of the lamination 142. A cutout 1424 is defined along a circumference of the lamination 142. An insulation portion 1426 vertically extends from a top of the lamination 142, along the circumference of the lamination 142, opposite to the cutout 1424. A conductive layer 1428 covers a center of a circumference of the insulation portion 1426, with two opposite ends of the insulation portion 1426 exposing out from the conductive layer 1428. The conductive layers 1428, 1422 are integrally connected. Each lamination 142 can be stacked up with another lamination 142. When two laminations 142 are stacked up, the insulation portion 1426 of a first lamination 142 is received in the cutout 1424 of a second lamination 142 and resists against a sidewall bounding the cutout 1424. All the laminations 142 are stacked up to form the capacitive component 14. The number of the laminations 142 is an even number. The conductive layers 1428 of the laminations 142 are aligned with one another, and arranged on opposite sides of the capacitive component 14, to function as an input terminal and an output terminal of the capacitive component 14 correspondingly. The conductive layers 1428 on each side of the laminations 142 are connected in series. The capacitive component 14 has capacitor characteristic.

A cutout is defined along a circumference of each of the insulation pieces 11, 13, 15. A structure of the cutout is similar to the cutout 1424 of each lamination 142. The insulation piece 11 is located on a first end of the magnetic cylinder 122. The insulation piece 13 is located between the inductive component 12 and the capacitive component 14. The resisting portion 1426 located on the capacitive component 14 is received in the cutout of the insulation piece 13, and resists against a sidewall bounding the cutout of the insulation piece 13. The insulation piece 15 is located at a second end of the capacitive component 14.

The connection member 16 is located on an upper surface of the insulation piece 11, opposite to the inductive component 12. The connection member 16 includes a round-shaped contact portion 161 and an L-shaped extension portion 162 horizontally extending from a circumference of the contact portion 161. A distal end of the extension portion 162 passes through the cutout of the insulation piece 11 to connect to a first terminal of the conductive coil 124. A second terminal of the conductive coil 124 is connected to the conductive layer 1428 located on the capacitive component 14.

The connection member 18 is located below the insulation piece 15, opposite to the capacitive component 14. The connection member 18 includes a round-shaped contact portion 181 and an L-shaped extension portion 182 horizontally extending from a circumference of the contact portion 181. A distal end of the extension portion 182 passes through the cutout of the insulation piece 15 to connect to the conductive layer 1422 located on the lowest lamination 142 of the capacitive component 14. The connection members 16, 18 function as an input terminal and an output terminal of the serial LC filtering unit 10 respectively.

Figure 6:
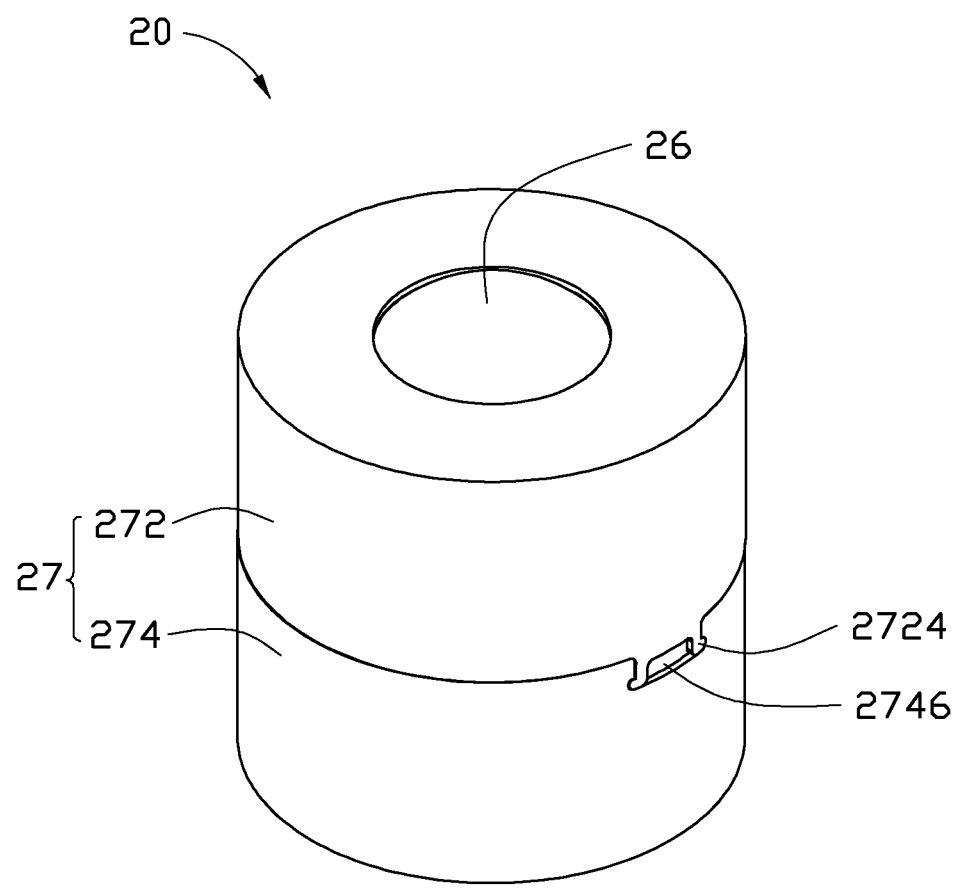
FIG. 6 is an isometric view of the parallel LC filtering unit of FIG. 2.
Figure 7:
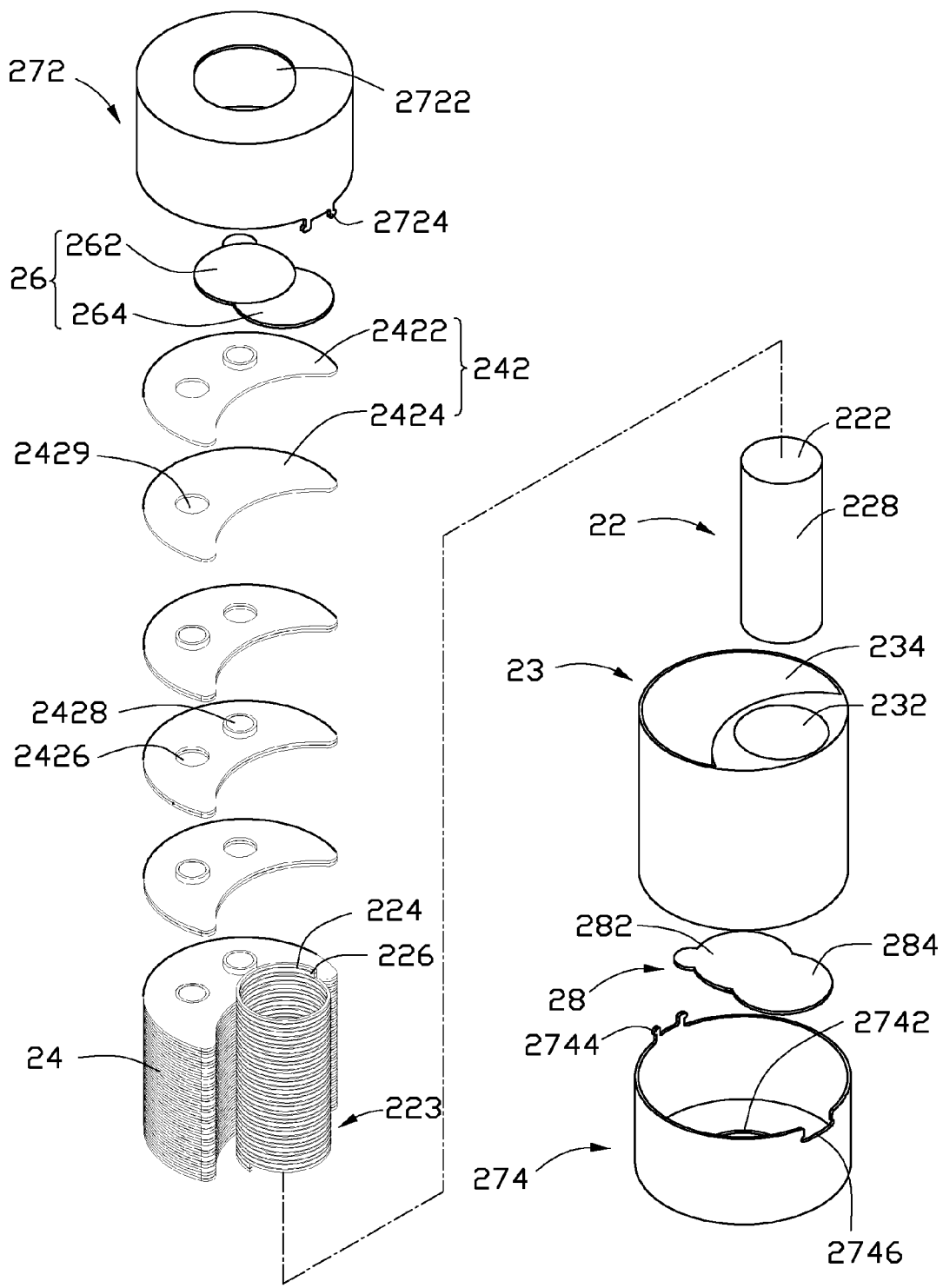
FIG. 7 is an exploded, isometric view of the parallel LC filtering unit of FIG. 6.

Referring to FIGS. 6 and 7, the parallel LC filtering unit 20 includes an inductive component 22, a capacitive component 24, two connection members 26 and 28, an insulation sleeve 23, and a receiving tube 27. The inductive component 22 and the capacitive component 24 are connected in parallel between the connection members 26 and 28, and are received in the insulation sleeve 23. The insulation sleeve 23 is received in the receiving tube 27.

The inductive component 22 includes a magnetic cylinder 222 and an elastic coil 223. A dielectric layer 228 covers a circumference of the magnetic cylinder 222. The conductive coil 223 includes a helical conductive coil 224 and a helical insulation coil 226 similarly structured with the conductive coil 124 and the insulation coil 126. The inductive component 22 has the same structure as the inductive component 12, and has an inductor characteristic.

The capacitive component 24 includes a number of detachable components. Each detachable component is a crescent-shaped lamination 242. Each crescent-shaped lamination 242 includes an insulation piece 2422, and a conductive piece 2424 similarly structured with the insulation piece 2422 and aligned with the insulation piece 2422. A through hole 2426 is defined in the insulation piece 2422. A through hole 2429 is defined in the conductive piece 2424. A conductive tab 2428 vertically extends from a top surface of the insulation piece 2424. When the insulation piece 2422 resists against the conductive piece 2424, the through hole 2429 of the conductive piece 2424 is aligned with the through hole 2426 of the insulation piece 2422. When a first lamination 242 is stacked up with a second lamination 242, the conductive tab 2428 of the second lamination 242 is passed through the through hole 2429 of the conductive piece 2424 of the first lamination 242 and inserted into the through hole 2426 of the first lamination 242, with a portion of the conductive tab 2428 extending out of the insulation piece 2422 of the first lamination 242. A circumference of the portion of the conductive tab 2428 extending out of the corresponding insulation piece 2422 is covered with insulation material.

All the laminations 242 are stacked up to form the capacitive component 24. For example, if three crescent-shaped laminations 242 are stacked up, the conductive tab 2428 of a first lamination 242 passes through the through holes 2429, 2426 of a second lamination 242, to connect to the insulation piece 2424 of a third lamination 242. Because a circumference of a portion of each conductive tab 2428 extending out of the adjacent lamination 242 is covered with insulation material, the conductive tab 2428 of the first lamination 242 and the second lamination 242 are insulated. The number of the laminations 242 is an even number. The capacitive component 24 has a capacitor characteristic. An upper end and a lower end of the capacitive component 24 function as an input terminal and an output terminal of the capacitive component 24 respectively.

The insulation sleeve 23 defines a circular-shaped first receiving recess 232 to receive the inductive component 22, and a crescent-shaped second receiving recess 234 separated from the first receiving recess 232 to receive the capacitive component 24, insulating the inductive component 22 and the capacitive component 24 received in the insulation sleeve 23 from each other.

The connection members 26 and 28 are located at opposite ends of the insulation sleeve 23 correspondingly. The connection member 26 includes two conductive contact portions 262, 264, connected to each other. The conductive contact portions 262, 264 are connected to a first end of the conductive coil 224 and the conductive tab 2428 located on the conductive piece 2424 located at the top of the capacitive component 24, respectively. The connection member 28 includes two conductive contact portions 282 and 284, connected to each other. The conductive contact portions 282, 284 are connected to a second end of the conductive coil 224 and the conductive piece 2424 located at the bottom of the capacitive component 24, respectively. Therefore, the inductive component 22 and the capacitive component 24 are connected in parallel.

The receiving tube 27 includes a lower portion 274 and an upper portion 272 covered on the lower portion 274. Each of the upper portion 272 and the lower portion 274 includes an end wall at a first end. Openings 2722, 2742 are defined in the end walls of the upper portion 272 and the lower portion 274, respectively. A latch 2724 extends from a circumference of a second end of the upper portion 272, opposite to the end wall of the upper portion 272. A slot opposite to the latch 2724 is defined in the circumference of the second end of the upper portion 272. A latch 2744 extends from a circumference of a second end of the lower portion 274, opposite to the end wall of the lower portion 274, and a slot 2746 opposite to the latch 2744 is defined in the circumference of the second end of the lower portion 274. The latch 2724 of the upper portion 272 can be received in the slot 2746 of the lower portion 274, and the latch 2744 of the lower portion 274 can be received in the slot of the top portion 272, to form the receiving tube 27. In other embodiments, the number and shapes of the slot and the latch can be adjusted as need.

The receiving tube 27 is mounted to the connection members 26 and 28, and receives the insulation sleeve 23, with one portion of the connection member 26 exposed through the opening 2722 of the upper portion 272 to connect to external components, one portion of the connection member 28 exposed through the opening 2742 of the lower portion 274 to connect to external components. The connection members 26 and 28 function as an input terminal and an output terminal of the parallel LC filtering unit 20 respectively.

Referring to FIG. 2 again, the receiving unit 30 includes a rectangular-shaped insulation main body 32 and two connection members 34, 36. Two separated through holes 322 and 324 are defined in the main body 32, through a first side and a second side opposite to the first side of the main body 32, to receive the serial LC filtering unit 10 and the parallel LC filtering unit 20 respectively. The connection member 34 is a conductor. The connection member 36 includes two conductors 361 and 363, insulatively connected to each other.

In assembly, the serial LC filtering unit 10 and the parallel LC filtering unit 20 are received in the through holes 322, 324 respectively. The connection member 18 of the serial LC filtering unit 10 and the connection member 26 of the parallel LC filtering unit 20 are located at the first side of the main body 32. The connection member 16 of the serial LC filtering unit 10 and the connection member 28 of the parallel LC filtering unit 20 are located at the second side of the main body 32. The connection member 34 is attached to the first side of the main body 32 to connect to the connection members 18, 26, with a first end of the connection member 34 connected to the connection member 18, a second end of the connection member 34 connected to the connection member 26. The connection member 36 is attached to the second side of the main body 32, with the conductor 361 grounded and connected to the connection member 16, and the conductor 363 connected to the connection member 28. The conductor 363 and the connection member 34 function as an input terminal and an output terminal of the filter 1, to connect to external devices. A groove 300 is defined in the first and second ends of the connection member 34 and each of the conductors 361, 363, facing the main body 32. The contact portion 181 of the connection member 18, the contact portion 262 of the connection member 26, the contact portion 282 of the connection member 28, and the contact portion 161 of the connection member 16 are received in the grooves 300 of the connection member 34, the conductors 361, 363, respectively. The contact portion 181 of the connection member 18, the contact portion 262 of the connection member 26, the contact portion 282 of the connection member 28, and the contact portion 161 of the connection member 16 are connected to the connection member 34, the conductors 361 and 363, respectively. A protrusion 340 extends from the second end of the connection member 34, to connect to external devices.

Figure 8:
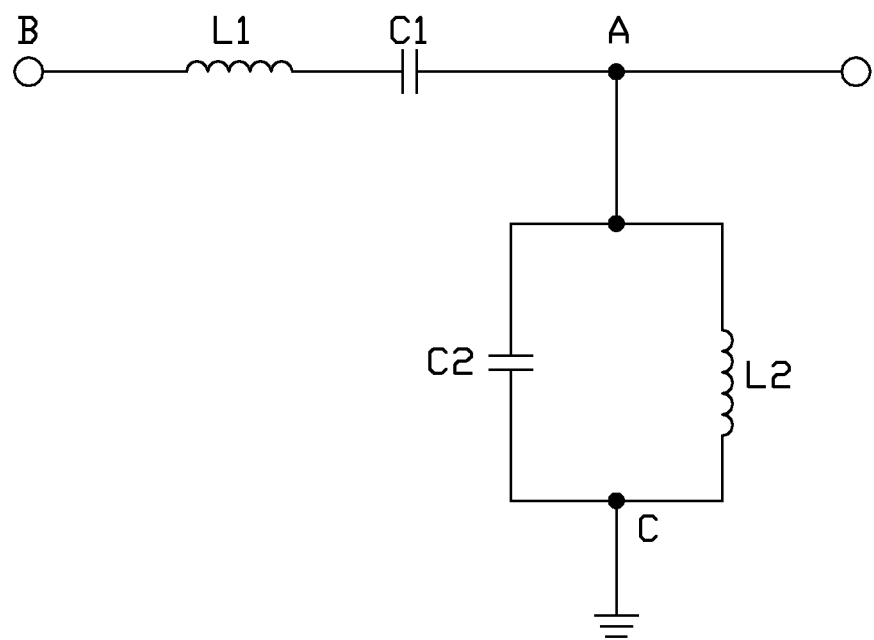
FIG. 8 is an equivalent circuit diagram of the RF filter of FIG. 1.

Referring to FIG. 8, an equivalent circuit of the filter 1 includes two inductors L1, L2, and two capacitors C1, C2. The inductive components 12, 22 facilitate as the inductors L1, L2 respectively. The capacitive components 14 and 24 facilitate as the capacitors C1 and C2, respectively. The connection member 34, the conductors 361 and 363 are nodes A, B, and C of FIG. 7, respectively. Therefore, the filter 1 has a band pass filter characteristic. In other embodiments, when the connection members 16 and 26 located at the first side of the main body 32 are connected via the connection member 34, and the connection member 18 is grounded via the connection member 361, the filter has a band stop filter characteristic.

Parameters of the filter 1 can be changed by changing structure of each component of the filter 1. For example, material of each component, diameters of each of the magnetic cylinders 122 and 222, density of each of the conductive coils 123, 124, and 126, thickness of the dielectric layers 128 and 228, counts of the laminations 142, 242, and thickness of the lamination 142 can be changed. When any component needs to be replaced, the filter 1 can be detached. When a plurality of filters 1 need to be connected in series, the input terminals and the output terminals of the plurality of filters 1 are connected in series. In other embodiments, the capacitive components 14 and 24 can include a number of other detachable components as need.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A radio frequency filter comprising:
   a parallel inductance capacitance (LC) filtering unit comprising a first inductive component and a first capacitive component connected in parallel, wherein a first terminal of the parallel LC filtering unit is grounded, the first capacitive component comprises a plurality of detachable first laminations, a capacitor characteristic of the first capacitive component varies with respect to a total number of the plurality of detachable first laminations; and
   a serial LC filtering unit comprising a second inductive component and a second capacitive component connected in series, wherein a first terminal of the serial LC filtering unit functions as an input terminal of the filter, a second terminal of the serial LC filtering unit is connected to a second terminal of the parallel LC filtering unit, and functions as an output terminal of the filter;
   wherein the parallel LC filtering unit further comprises a first insulation sleeve, the serial LC filtering unit further comprises a second insulation sleeve, the first inductive component and the first capacitive component are received in the first insulation sleeve, and the second inductive component and the second capacitive component are received in the second insulation sleeve.

2. The filter of claim 1, wherein each of the first and second inductive components comprises a magnetic cylinder and an elastic conductive coil coiling around the magnetic cylinder, a dielectric layer covers a circumference of the magnetic cylinder, two terminals of the conductive coil of the first inductive component function as the first and second terminals of the first inductive component, respectively, and two terminals of the conductive coil of the second inductive component function as the first and second terminals of the second inductive component, respectively.

3. The filter of claim 2, wherein each of the first and second inductive components further comprises a helical insulation coil, each of the conductive coil and the corresponding insulation coil stagger with each other to coil around the corresponding magnetic cylinder, to prevent each coil of the conductive coil from contacting with adjacent coils.

4. The filter of claim 1, wherein each first lamination comprises a first insulation piece, and a conductive piece stacked up with the first insulation piece, a first through hole is defined in the first insulation piece, a conductive tab vertically extends from a top surface of the first insulation piece to pass through the conductive piece and the first through hole of another of the plurality of detachable first laminations above the conductive tab, a circumference of a portion of the conductive tab extending out of the corresponding first insulation piece is made of insulation material, the conductive tab located at the top of the first capacitive component is connected to a first terminal of the first inductive component via a first connection member, the conductive piece located at the bottom of the first capacitive component is connected to a second terminal of the first inductive component via a second connection member, to make the first capacitive component and the first inductive component be connected in parallel.

5. The filter of claim 4, wherein the second capacitive component comprises a plurality of detachable second laminations, a first conductive layer is located at a circumference of each second lamination, adjacent to a bottom of the corresponding second lamination, a height of the first conductive layer is less than a height of the corresponding second lamination, a cutout is defined along the circumference of the corresponding second lamination, an insulation portion vertically extends from a top of the corresponding second lamination, along the circumference of the corresponding second lamination, opposite to the cutout, a second conductive layer covers a center of an outer surface of the insulation portion, with two opposite ends of the insulation portion exposed out from the second conductive layer, the second conductive layer located on the second capacitive component is connected to a first terminal of the second inductive component, to make the second capacitive component and the second inductive component connect in series, a second terminal of the second inductive component functions as the first terminal of the serial LC filtering unit, the second conductive layer located at a bottom of the second capacitive component functions as the second terminal of the serial LC filtering unit, the first connection member functions as the second terminal of the parallel LC filtering unit, and the second connection member functions as the first terminal of the parallel LC filtering unit.

6. The filter of claim 5, wherein a second through hole is defined in the conductive piece of each first lamination, for the conductive tab passing through.

7. The filter of claim 5, wherein the insulation portion of one of the plurality of second laminations is received in the cutout of an adjacent one of the plurality of detachable second laminations and resists against a sidewall bounding the cutout of the corresponding adjacent second lamination, the second conductive layers of the plurality of second laminations connected are arranged on opposite sides of the second capacitive component.

8. The filter of claim 5, wherein the parallel LC filtering unit further comprises a receiving tube, the first and second connection members are located on opposite ends of the first insulation sleeve, respectively, and the first and second connection members and the first insulation sleeve are received in the receiving tube, the receiving tube comprises a lower portion and an upper portion covered on the lower portion, each of the upper portion and the lower portion comprises an end wall at a first end, an opening is defined in the end wall of each of the upper portion and the lower portion, respectively, one portion of the first connection member extends out of the opening of the upper portion, one portion of the second connection member extends out of the opening of the lower portion.

9. The filter of claim 5, wherein the serial LC filtering unit further comprises third and fourth connection members, the third connection member is connected to the first terminal of the serial LC filtering unit, and the fourth connection member is connected to the second terminal of the serial LC filtering unit.

10. The filter of claim 9, wherein the serial LC filtering unit further comprises second to fourth insulation pieces, a cutout is defined along a circumference of each of the second to fourth insulation pieces, the second insulation piece is located between the second terminal of the second inductive component and a first contact portion of the third connection member, the third insulation piece is located between the second inductive component and the second capacitive component, a resisting portion located on the top of the second capacitive component is received in the cutout of the third insulation piece, the fourth insulation piece is located between the second capacitive component and a second contact portion of the fourth connection member, the third connection member comprises a first extension portion horizontally extending from a circumference of the first contact portion, a distal end of the first extension portion passes through the cutout of the second insulation piece to connect to a first terminal of the second conductive coil, a second terminal of the second conductive coil is connected to the second conductive layer located at the top of the second capacitive component, the fourth connection member comprises a second extension portion horizontally extending from a circumference of the second contact portion, one terminal of the second extension portion passes through the cutout of the fourth insulation piece to connect to the first conductive layer located at the bottom of the second capacitive component.

11. The filter of claim 10, wherein the parallel LC filtering unit is connected to the serial LC filtering unit via a receiving unit, the receiving unit comprises an insulation main body and fifth and sixth connection members, the fifth connection member is a conductor, the sixth connection member comprises insulated first and second conductors, two separated second through holes are defined in the main body, through a first side and a second side opposite to the first side of the main body to receive the serial LC filtering unit and the parallel LC filtering unit, respectively, the first and third connection members connected via the fifth connection member are located at the first side of the main body, the second and fourth connection members are located at the second side of the main body, the first conductor is grounded and connected to the second connection member, the fourth connection member is connected to the second conductor.

* * * * *